US012627155B2

(12) United States Patent
Irish et al.

(10) Patent No.: US 12,627,155 B2
(45) Date of Patent: May 12, 2026

(54) SYSTEM FOR BALANCING AND CONVERTING VOLTAGE OUTPUT FOR PHOTOVOLTAIC MODULES

(71) Applicant: Optivolt Labs, Inc., San Francisco, CA (US)

(72) Inventors: Linda Stacey Irish, San Francisco, CA (US); Sierra Rae King, San Francisco, CA (US); Kevin Rodriguez, San Francisco, CA (US)

(73) Assignee: Optivolt Labs, Inc., San Francisco, CA (US)

( * ) Notice: Subject to any disclaimer, the term of this patent is extended or adjusted under 35 U.S.C. 154(b) by 0 days.

(21) Appl. No.: 18/956,894

(22) Filed: Nov. 22, 2024

(65) Prior Publication Data

US 2025/0088008 A1      Mar. 13, 2025

Related U.S. Application Data

(63) Continuation of application No. 18/541,636, filed on Dec. 15, 2023, now Pat. No. 12,191,671, which is a continuation-in-part of application No. 18/211,974, filed on Jun. 20, 2023, now Pat. No. 12,288,990, which is a continuation of application No.
(Continued)

(51) Int. Cl.
| | |
|---|---|
| *H02J 3/38* | (2006.01) |
| *G01R 19/165* | (2006.01) |
| *G05F 1/67* | (2006.01) |
| *H02J 3/26* | (2006.01) |
| *H02J 7/00* | (2006.01) |
| *H02S 40/34* | (2014.01) |
| *H02S 40/36* | (2014.01) |

(52) U.S. Cl.
CPC ........ *H02J 3/381* (2013.01); *G01R 19/16538* (2013.01); *G05F 1/67* (2013.01); *H02J 3/26* (2013.01); *H02J 7/0016* (2013.01); *H02S 40/34* (2014.12); *H02S 40/36* (2014.12); *H02J 2300/26* (2020.01)

(58) Field of Classification Search
CPC .. H02J 3/26; H02J 3/381; H02J 7/0016; H02J 2300/26; H02S 40/34; H02S 40/36; G01R 19/16538; G05F 1/67
USPC .......................................................... 307/78
See application file for complete search history.

(56) References Cited

U.S. PATENT DOCUMENTS 9,407,093 B2 *   8/2016   Cummings ........... H10F 77/955

* cited by examiner

*Primary Examiner* — Hal Kaplan
(74) *Attorney, Agent, or Firm* — Run8 Patent Group, LLC; Peter Miller

(57) ABSTRACT

A system for balancing and converting voltage output from photovoltaic modules includes a set of solar substrings and a power conversion circuit. The power conversion circuit includes a balancing section configured to balance voltage output from the set of solar substrings. The power conversion circuit also includes a voltage control section including: a first transformer coupled to the set of solar substrings and configured to step-up voltage from the set of solar substrings; a second transformer arranged in series to the first transformer; and an output capacitor coupled to the second transformer. The system further includes a controller configured to: drive a set of modulation signals to the balancing section and the voltage control section; alternate voltage polarities across the first transformer and the second transformer; and modify output voltage of the power conversion circuit to a target output voltage.

20 Claims, 11 Drawing Sheets

Related U.S. Application Data

17/484,615, filed on Sep. 24, 2021, now Pat. No. 11,728,656.

(60) Provisional application No. 63/465,706, filed on May 11, 2023, provisional application No. 63/434,426, filed on Dec. 21, 2022, provisional application No. 63/083,817, filed on Sep. 25, 2020.

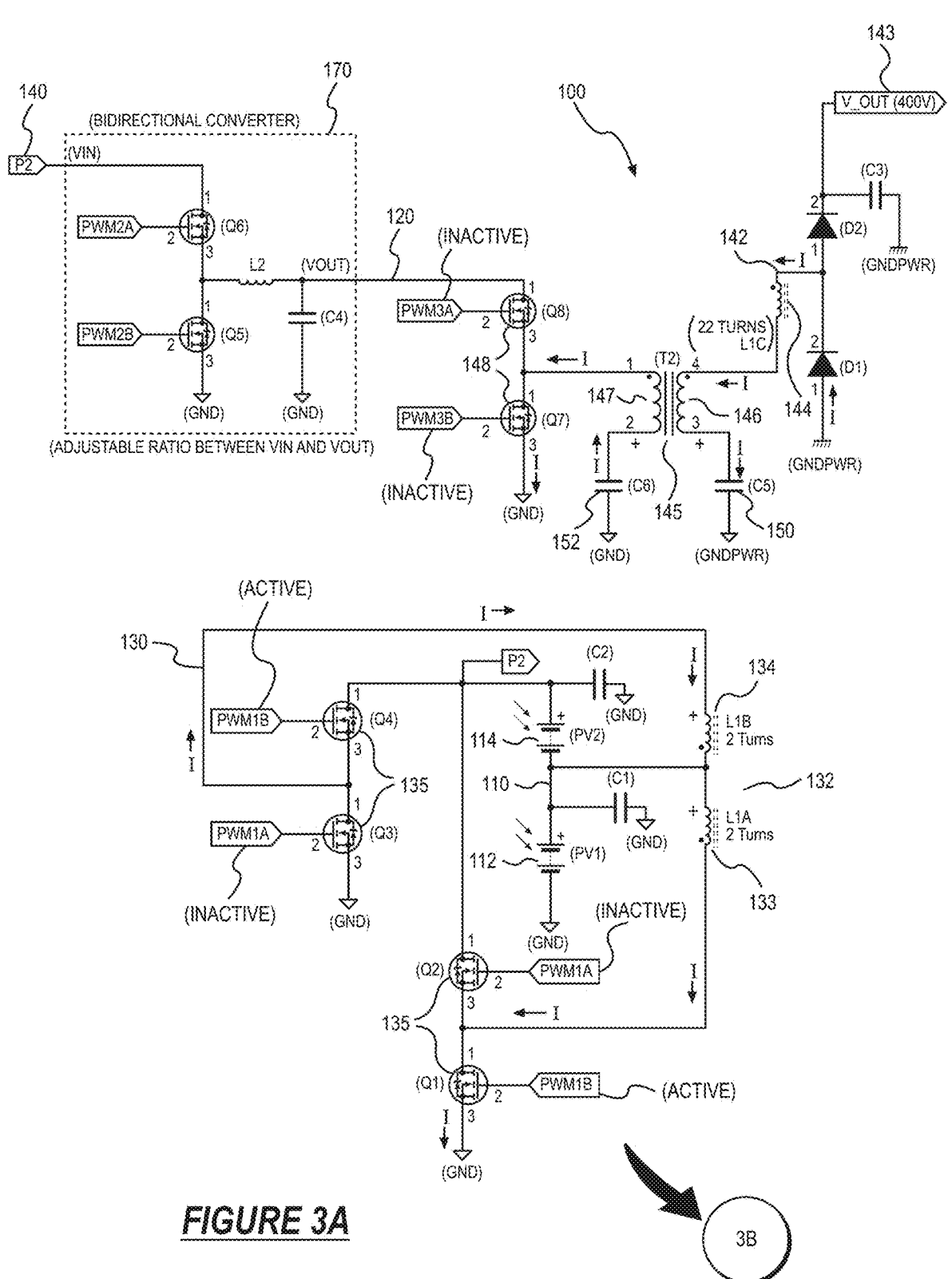
_FIGURE 3A_

100

106

(SUBSTRING A)          (SUBSTRING C)

105

(NEGATIVE (-) 'SUBSTRING C' END)

(MIDPOINT VOLTAGE OF 'SUBSTRING C')

(POSITIVE (+) 'SUBSTRING C' START)

(SUBSTRING B)

112          112

SYSTEM FOR BALANCING AND CONVERTING VOLTAGE OUTPUT FOR PHOTOVOLTAIC MODULES

CROSS-REFERENCE TO RELATED APPLICATIONS

This application is a continuation of U.S. Non-Provisional application Ser. No. 18/541,636, filed on 15 Dec. 2023, which claims the benefit of U.S. Provisional Application No. 63/434,426, filed on 21 Dec. 2022, and 63/465,706, filed on 11 May 2023, each of which is incorporated in its entirety by this reference.

Application Ser. No. 18/541,636 is also a continuation-in-part of U.S. Non-Provisional application Ser. No. 18/211,974, filed on 20 Jun. 2023, which is a continuation of U.S. Non-Provisional application Ser. No. 17/484,615, filed on 24 Sep. 2021, which claims the benefit of U.S. Provisional Application No. 63/083,817, filed on 25 Sep. 2020, each of which is incorporated in its entirety by this reference.

This application is related to U.S. Non-Provisional application Ser. No. 18/129,321, filed on 31 Mar. 2023, and Ser. No. 18/371,209, filed on 21 Sep. 2023, each of which is incorporated in its entirety by this reference.

TECHNICAL FIELD

This invention relates generally to the field of photovoltaic modules and more specifically to a new and useful system for balancing and converting voltage output in the field of photovoltaic modules.

BRIEF DESCRIPTION OF THE FIGURES

FIGS. 3A and 3B are schematic representations of the system;

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. System

Figure 1:
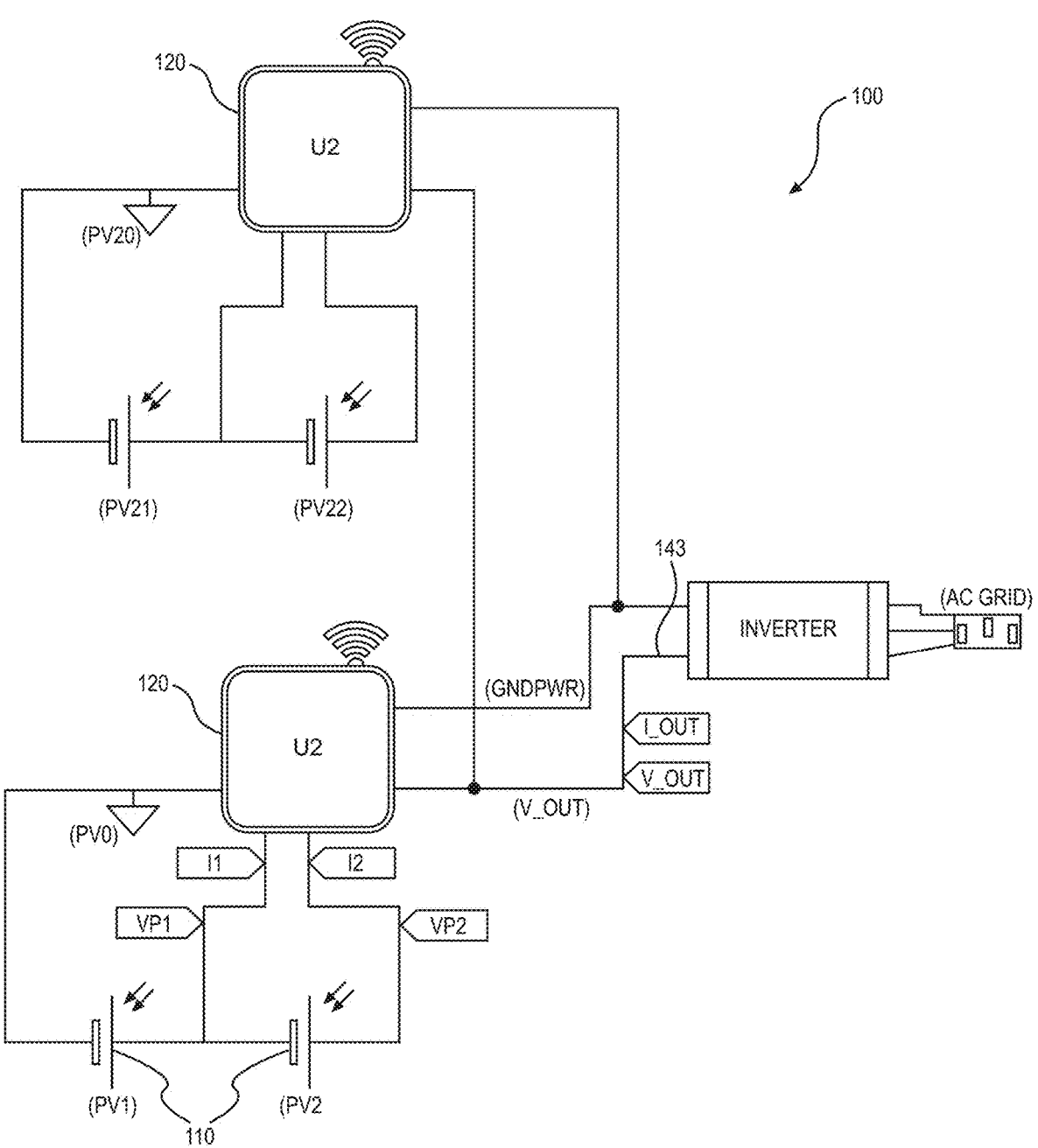
FIG. 1 is a schematic representation of a system.
Figure 2A:
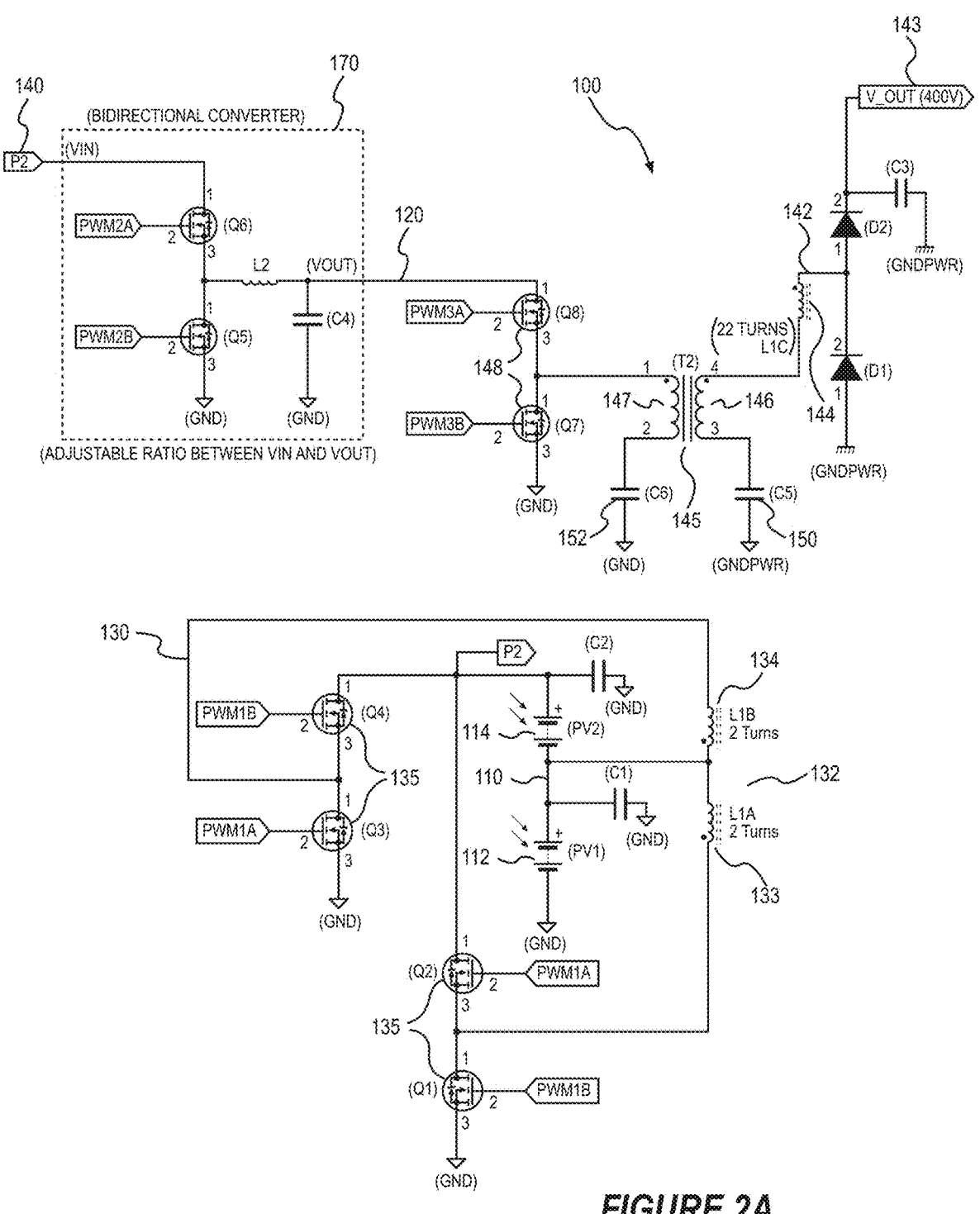
FIGS. 2A and 2B are schematic representations of the system.
Figure 2B:
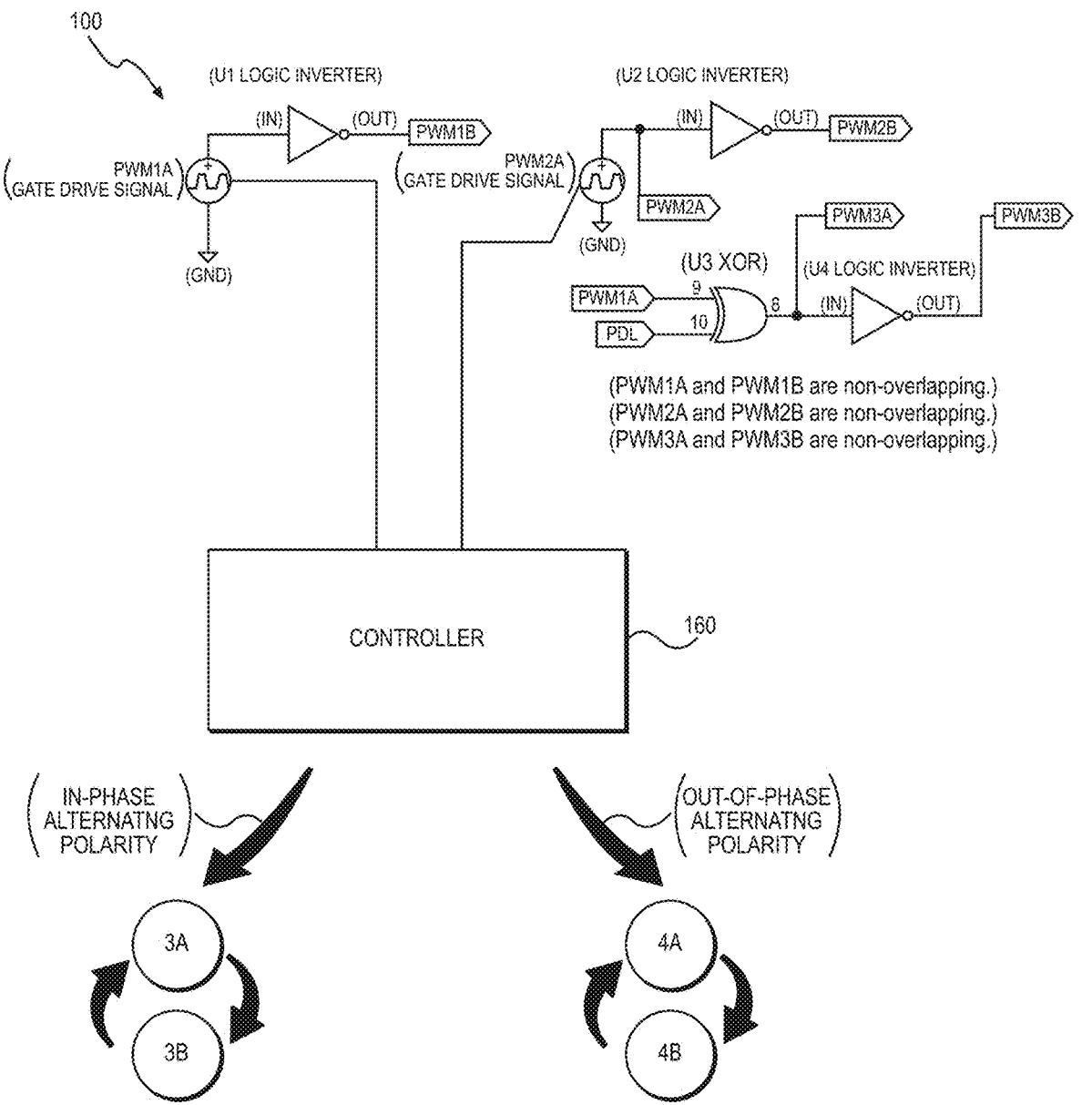

As shown in FIGS. 1, 2A, and 2B, a system 100 for balancing and converting output voltage for photovoltaic modules includes: a first set of solar substrings 110; a power conversion circuit 120; and a controller 160.

The power conversion circuit 120 includes a balancing section 130 including: a first set of windings 132 arranged in parallel to the first set of solar substrings 110 configured to balance voltage output across the first set of solar substrings 110; and a first set of switches 135 coupled to the first set of solar substrings 110 and the first set of windings 132 and configured to alternate voltage polarity across the first set of windings 132.

The power conversion circuit 120 also includes a voltage control section 140 including: a second set of windings 142; a second transformer 145; an output capacitor 150; and a second set of switches 148. The second set of windings 142 are: arranged parallel to the first set of windings 132 to form a first transformer 144; configured to step-up voltage across the first set of windings 132; and coupled to a voltage output terminal 143. The second transformer 145 includes: a third set of windings 146 arranged in series with the second set of windings 142; and a fourth set of windings 147 arranged in parallel with the third set of windings 146. The output capacitor 150 is arranged in series with the third set of windings 146. The second set of switches 148 are: coupled to an output of the first set of solar substrings 110 and the fourth set of windings 147; and configured to alternate voltage polarity across the second transformer 145 to transfer energy to the output capacitor 150.

The controller 160 is configured to, in response to a first output voltage at the voltage output terminal 143 deviating from a target output voltage, trigger a first modulation signal at the first set of switches 135 to: balance voltage output from the first set of solar substrings 110 across the first set of windings 132; and induce a first alternating voltage polarity across the first transformer 144. Additionally, the controller 160 is configured to, in response to the first output voltage deviating from the target output voltage, trigger a second modulation signal at the second set of switches 148 to: induce a second alternating voltage polarity across the second transformer 145; and transfer energy from the output capacitor 150 through the second transformer 145 and the first transformer 144 to modify the first output voltage toward the target output voltage.

2. Applications

Generally, the system 100 functions: as a voltage-balancing circuit to balance voltages across a series of solar substrings within a solar panel 105; and as a voltage converter 170 circuit to modify (e.g., increase, attenuate) voltage output from the series of solar substrings. Once the solar panel 105 is deployed, environmental conditions—such as position of clouds, position of the Sun, local fog conditions, etc.—can yield non-uniform illuminance of each solar substring in the solar panel 105, which can decrease a nominal output voltage of the series of solar substrings in the solar panel 105. Therefore, the system 100 can: balance voltages across each solar substring in the series of solar substrings; and maintain a target output voltage regardless of the environmental conditions affecting illumination of the series of solar substrings.

The system 100 includes: a balancing section 130 coupled to the set of solar substrings 110 and configured to balance an output voltage across the set of solar substrings 110; and a voltage control section 140 connected to the balancing section 130 configured to modify the output voltage (e.g., 18 volts) across the set of solar substrings 110 to a target output voltage (e.g., 400 volts). The balancing section 130 can include a set of windings (e.g., windings of a transformer, inductor): arranged in parallel to the set of solar substrings 110 and configured to balance an output voltage from the set of solar substrings 110. Additionally, the balancing section 130 includes a first set of switches 135: coupled to the set of solar substrings 110 and the set of windings; and configured to route an output current from the set of solar substrings 110 across the first set of windings 132. In particular, the controller 160 can: trigger a first modulation signal to the first set of switches 135; and induce an alternating voltage polarity across the set of windings while simultaneously balancing the voltage output from the set of solar substrings 110 across the set of windings.

The voltage control section 140 includes a second set of windings 142 (e.g., windings of a transformer): arranged in parallel to the first set of windings 132 forming a first transformer 144; configured to step-up a voltage induced across the first set of windings 132; and connected to a voltage output terminal 143 (e.g., connected to an inverter, AC grid). Additionally, the voltage control section 140 includes a second transformer 145: including a third set of windings 146 arranged in series with the second set of windings 142 and coupled to an output capacitor 150; and a fourth set of windings 147 arranged parallel to the third set of windings 146 and connected to a second set of switches 148. The set of switches are connected to a voltage converter 170 (e.g., bidirectional converter): coupled to the second switches and the set of solar substrings 110; and configured to route an output current from the set of solar substrings 110 across the fourth set of windings 147. The controller 160 can thus: trigger a second modulation signal to the second set of switches 148; and induce an alternating voltage polarity across the second transformer 145 while simultaneously modifying an output voltage at the voltage output terminal 143 to a target output voltage.

In one example, the controller 160 can operate (e.g., via modulation signals) the first set of switches 135 and the second set of switches 148 between: an in-phase configuration to increase voltage output at the voltage output terminal 143; and an out-of-phase configured to attenuate voltage output at the voltage output terminal 143. In the in-phase configuration, the system 100 induces the first transformer 144 and the second transformer 145 to operate in an in-phase (or "matching") alternating voltage polarity thus: additively routing voltage across the second set of windings 142, the third set of windings 146, and the output capacitor 150 toward the voltage output terminal 143; and increasing voltage output at the voltage output terminal 143 to a target voltage. In this out-of-phase configuration, the system 100 induces the first transformer 144 and the second transformer 145 to operate in an out-of-phase (of "different") alternating voltage polarity thus: substantively routing voltage across the second set of windings 142, the third set of windings 146, and the output capacitor 150 toward the voltage output terminal 143; and attenuating the voltage output at the voltage output terminal 143 to the target voltage. In this example, the controller 160 can implement maximum power point tracking (hereinafter "MPPT") techniques to: read an output voltage from the voltage output terminal 143; and, in response to the output voltage deviating from a target voltage, alternate the first set of switches 135 and the second set of switches 148 between an in-phase configuration and an out-of-phase configuration to modify the output voltage toward the target voltage.

Therefore, the system 100 can: balance voltage output across the series of solar substrings regardless of environmental conditions; modify (e.g., increase, attenuate) nominal voltage output from the series of solar substrings; and maintain a target voltage output to a target voltage during operation of the system 100.

3. Photovoltaic Modules

Generally, the system 100 can include (or couple to, interface with) a set of photovoltaic modules, each including: a solar panel 105 containing a series of solar substrings;

and a power conversion circuit 120 connected to the series of solar substrings and a target load (e.g., mobile device, a robotic system 100). Furthermore, the system 100 can include: a controller 160 mounted directly to the power conversion circuit 120; and a controller 160 interface (e.g., HDMI) to connect the controller 160 to an external device (e.g., mobile computing device).

In one implementation, the system 100 includes a chassis containing: the power conversion circuit 120 arranged on a PCBA; a battery connected to the power conversion circuit 120; a controller 160 configured to implement MPPT techniques; and a controller 160 interface connected to the controller 160. In this implementation, the system 100 includes the chassis: mounted to a rear end of the solar panel 105; and connected to the series of solar substrings on the solar panel 105. Thus, the system 100 can regulate (e.g., increase and/or attenuate) DC voltage output from the series of solar substrings to maintain a target voltage output.

In another implementation, the system 100 includes a chassis containing the power conversion circuit 120: arranged on the PCBA; and connected to a series of solar substrings arranged on the solar panel 105. In this implementation, voltage output generated by the series of solar substrings in the solar panel 105 enables continuous operation of the power conversion circuit 120.

In another implementation, the system 100 can further include each photovoltaic module—in the set of photovoltaic modules—is connected to each other (e.g., in series, in parallel) in order to regulate power voltage delivered to the target load connected to the set of photovoltaic modules. In one example, the system 100 includes each photovoltaic module—in the set of photovoltaic modules—including a wireless communication module (e.g., Bluetooth, WIFI). Thus, the system 100 can implement MPPT techniques across the set of photovoltaic modules to generate and maintain a target output voltage to the target load.

4. Power Conversion Circuit

Generally, the system 100 can include a power conversion circuit 120: including a balancing section 130 coupled to the set of solar substrings 110 and configured to balance an output voltage across the set of solar substrings 110; and a voltage control section 140 coupled to the balancing section 130 and configured to modify the output voltage from the set of solar substrings 110 to a target output voltage. In particular, the power conversion circuit 120 routes current output (e.g., via switches) from the set of solar substrings 110: to induce a first alternating voltage across a first transformer 144; and to induce a second alternating voltage (e.g., in-phase or out-of-phase with the first alternating voltage) across the second transformer 145, that cooperates with the first alternating voltage to modify (e.g., increase, attenuate) an output voltage from the power conversion circuit 120.

Furthermore, the system 100 can include a set of diodes and/or a second set of switches 148 connected to the series of windings to reduce leakage inductance during operation of the system 100.

4.1 Balancing Section

In one implementation, the system 100 includes a power conversion circuit 120 including a balancing section 130 coupled to the set of solar substrings 110. In this implementation, the set of solar substrings 110 includes: a first solar substring 112; and a second solar substring 114 arranged in series with the first solar substring 112 to define a first junction. Additionally, the balancing section 130 includes a first set of windings 132 (e.g., windings of a transformer) including: a first winding 133 (e.g., 2 turn winding) arranged in parallel to the first solar substring 112; and a second winding 134 (e.g., 2 turn winding) arranged in parallel to the second solar substring 114. The first winding 133 and the second winding 134: are arranged in series to define a second junction; and coupled to the first set of solar substrings 110 via the first junction. Thus, during operation of the system 100, voltage output from the set of solar substrings 110 is balanced across the first set of windings 132 via parallel coupling of the set of solar substrings 110 and the first set of windings 132 regardless of illumination conditions affecting the set of solar substrings 110.

Additionally, the balancing section 130 includes a first set of switches 135 (e.g., transistors) including: a first subset of switches coupled to the set of solar substrings 110 and the first winding 133; and a second subset of switches coupled to the set of solar substrings 110 and the second winding 134. The first subset of switches includes: a first switch coupled to a voltage output from the set of solar substrings 110; and a second switch arranged in series with the first switch defining a third junction coupled to the first winding 133. The second subset of switches includes: a third switch coupled to the voltage output from the set of solar substrings 110; and a fourth switch arranged in series to the third switch defining a fourth junction coupled to the second winding 134. In this implementation, the system 100 can: trigger a first modulation signal at the first set of switches 135 to route current from the set of solar substrings 110 across the first set of windings 132; and induce an alternating voltage polarity across the first set of windings 132.

In particular, the system 100 can alternate operating states (e.g., on-state, off-state) between the first subset of switches and the second subset of switches in order to induce alternating voltage polarity across the first set of windings 132. For example, the system 100 can: trigger the first modulation signal (e.g., square wave) at the first switch and the fourth switch; and trigger an inverse first modulation signal (e.g., inversely proportional to the first modulation signal) at the second switch and the third switch (e.g., via a logic inverter). Thus, the system 100 can operate (e.g., at a target duty cycle) the first set of switches 135 between: a first operating state in which the first switch and the fourth switch are in the on-state, and the second switch and the third switch are in the off-state; and a second operating state in which the first switch and the fourth switch are in the off-state, and the second switch and the third switch are in the on-state. In the first operating state, current output from the set of solar substrings 110 is routed through the first switch, the first set of windings 132, and the fourth switch to define a first voltage polarity. In the second operating state, current output from the set of solar substrings 110 is routed through the third switch, the first set of windings 132, and the second switch to define a second voltage polarity different from the first polarity.

Therefore, the system 100 can trigger the first modulation signal at the first set of switches 135 to: induce an alternating voltage polarity across the first set of windings 132; and balance voltages output from the set of solar substrings 110 regardless of environmental conditions (e.g., shadows, clouds) affecting the set of solar substrings 110.

4.1.1 Solar Panel Parallelization

Figure 5:
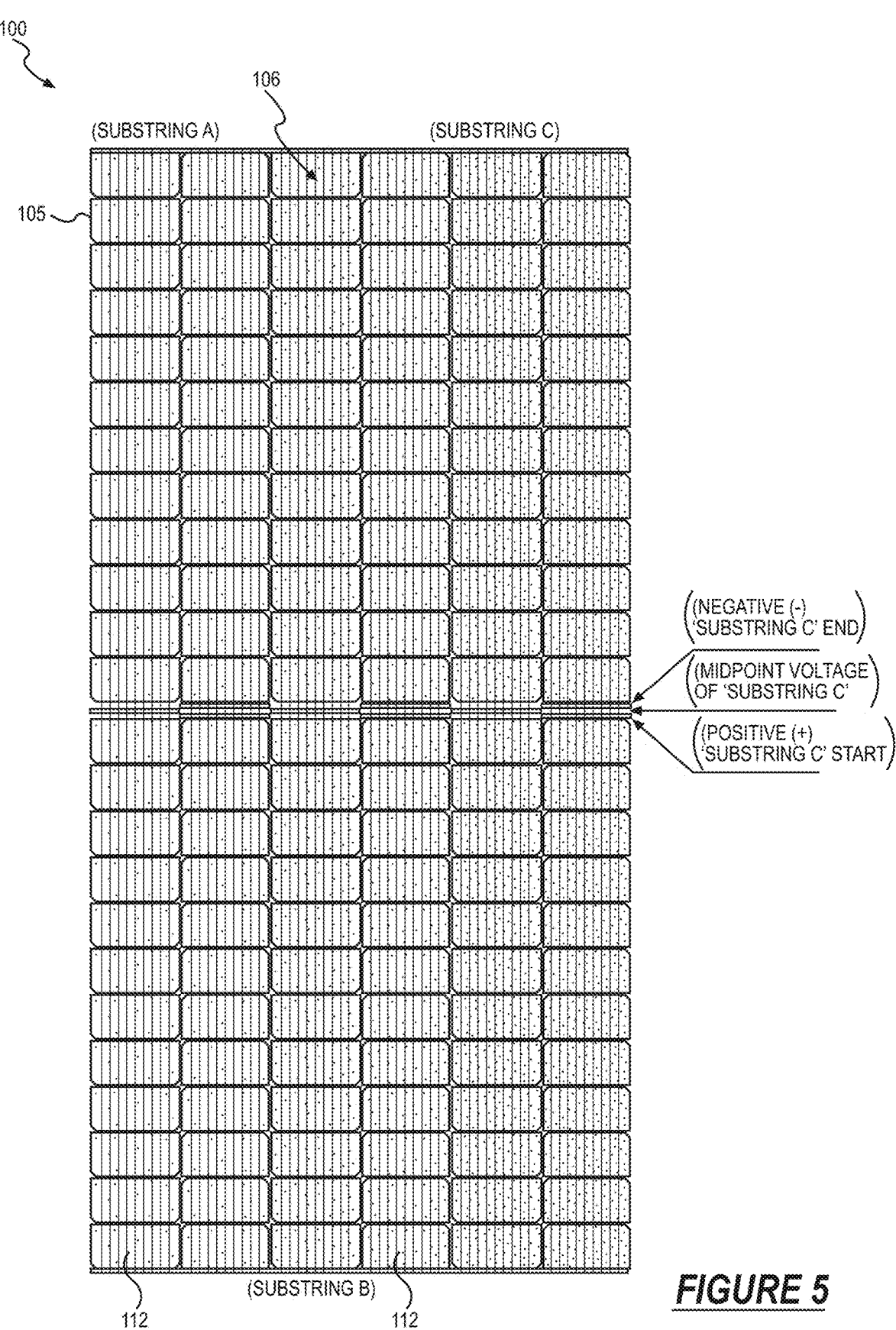
FIG. 5 is a schematic representation of the system.
Figure 6:
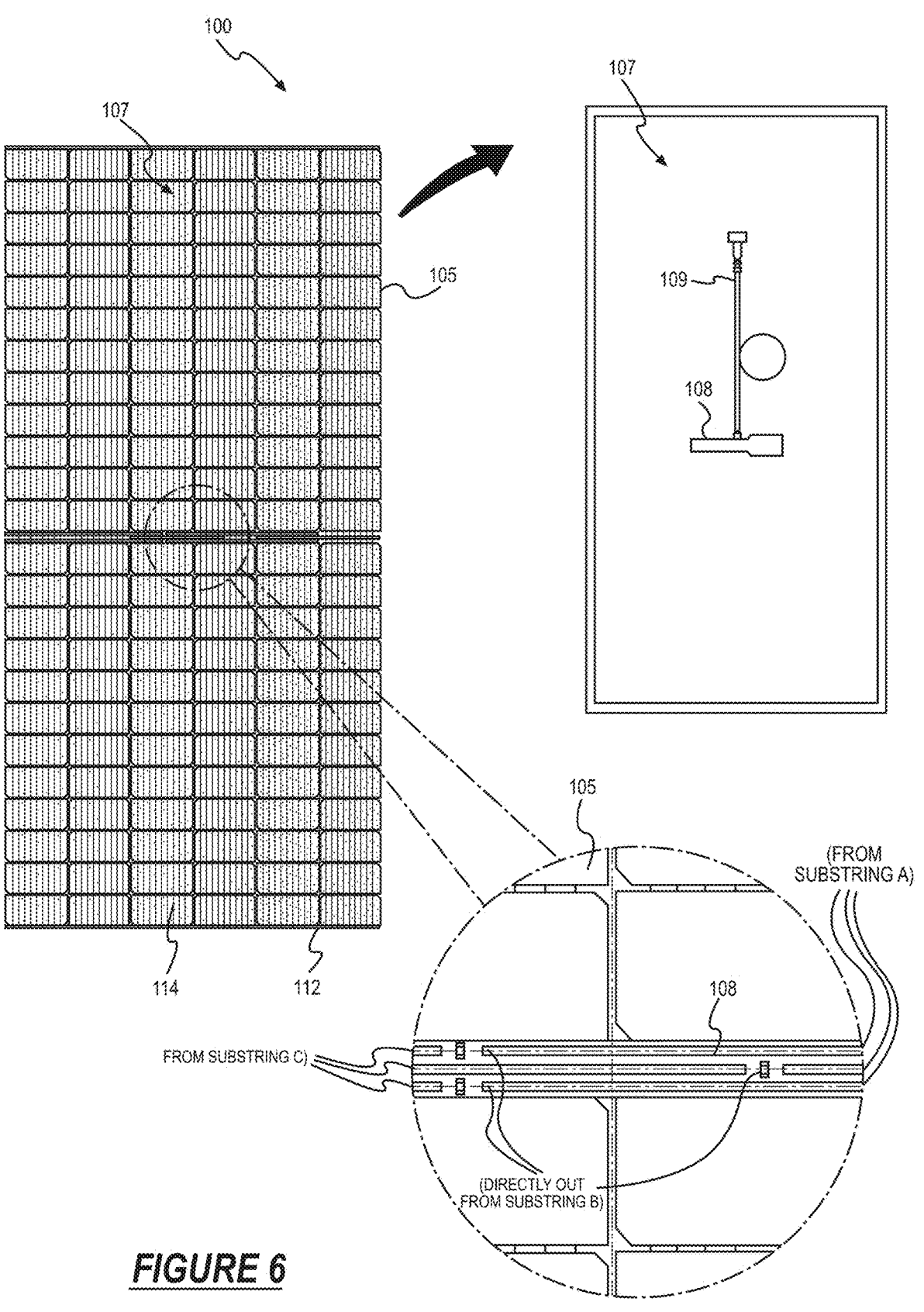
FIG. 6 is a schematic representation of the system.
Figure 7:
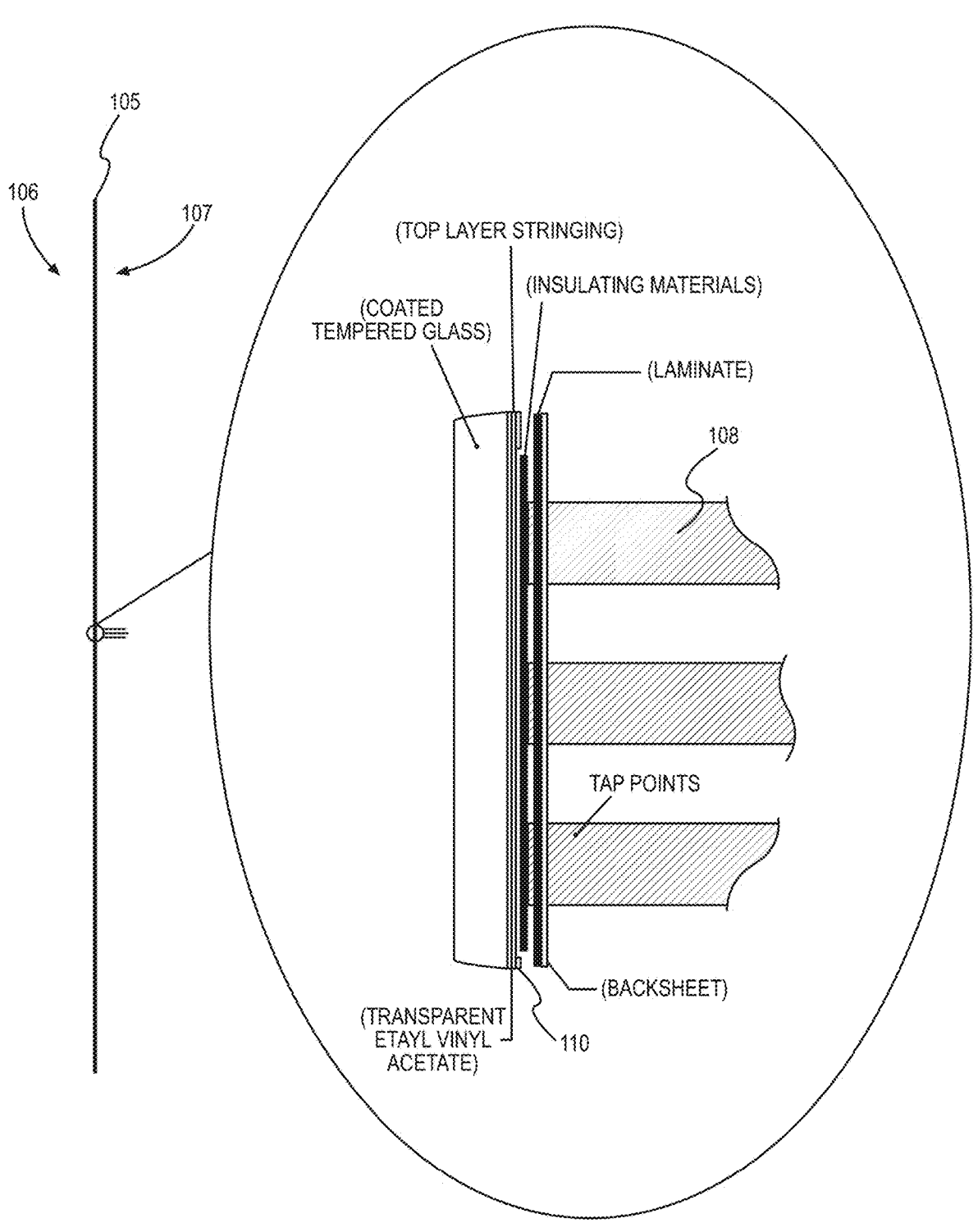
FIG. 7 is a schematic representation of the system.
Figure 8:
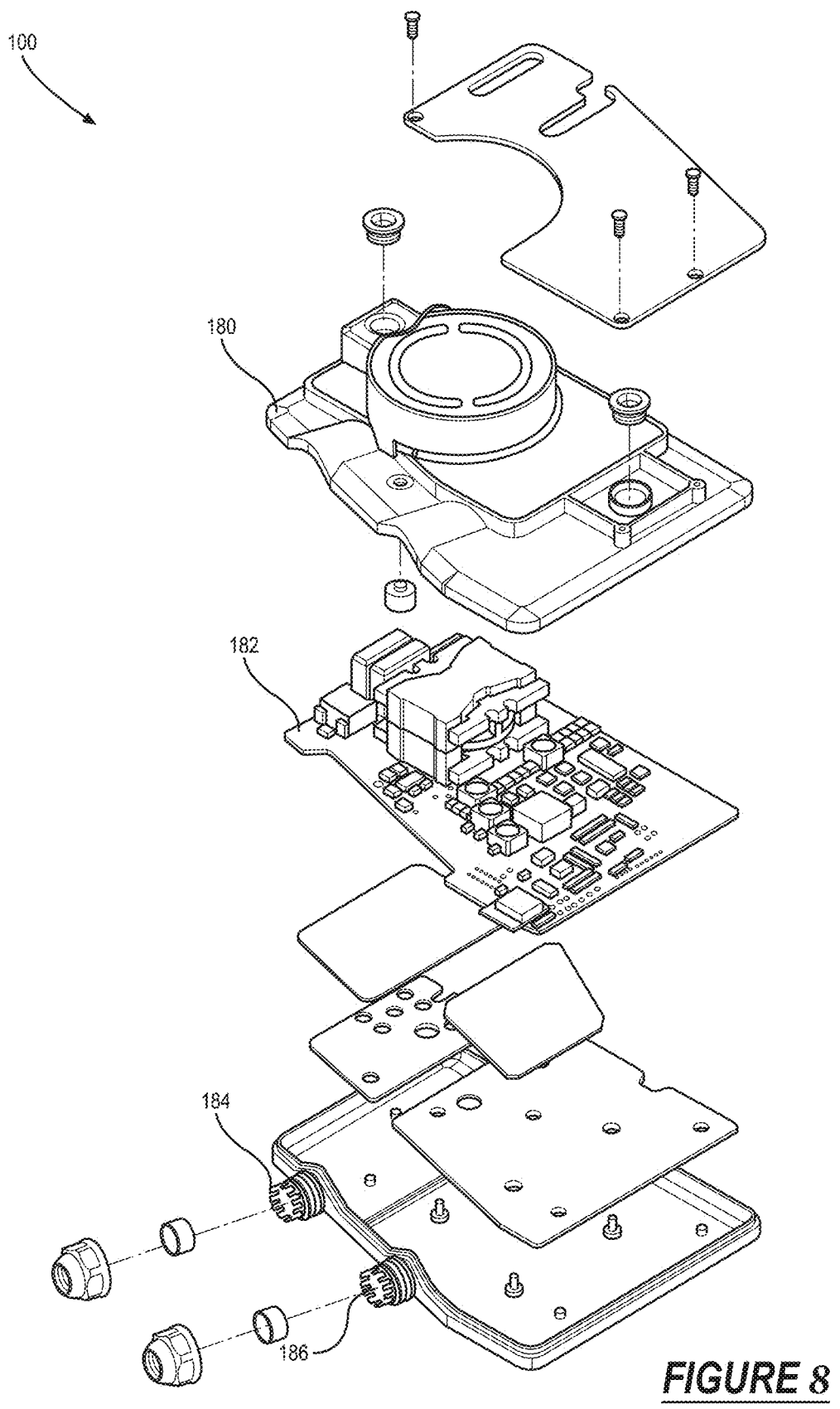
FIG. 8 is a schematic representation of the system.

Generally, as shown in FIGS. 5, 6, and 7, the system 100 includes a solar panel 105 including the set of solar substrings 110. More specifically, the set of solar substrings 110 can include a first solar substring 112: spanning a first area of the solar panel 105; and configured to illuminate a first operating voltage responsive to a first illumination condition. Additionally, the set of solar substrings 110 can include a second solar substring 114: spanning a second area, adjacent the first area, of the solar panel 105; coupled in parallel to the first solar substring 112; and configured to output a second operating voltage—less than the first operating voltage—responsive to a second illumination condition different from the first illumination condition.

In one implementation, the first solar substring 112 and the second solar substring 114 cooperate to output a maximum operating voltage (i.e., both operating at a maximum illumination condition) of 30-volts which is supplied to the power conversion circuit 120. In this implementation, the power conversion circuit 120 is configured to step-up the output voltage from the set of solar substrings 110 to a target output voltage, such as a high-voltage output of 400 volts. However, environmental conditions (e.g., shadows, clouds, debris, structures) reduce illumination conditions across the first solar substring 112 and the second solar substring 114 which results in output of a nominal operating voltage less than the maximum operating voltage of the set of solar substrings 112. Accordingly, the power conversion circuit 120 is configured to: balance voltage output from the first solar substring 112 and the second solar substring 114 to a nominal operating voltage across the first set of windings 132; and maintain the target output voltage (e.g., 400 volts) at a voltage output terminal 143 coupled to an inverter which subsequently feeds the target output voltage to a power grid (e.g., alternating current power grid).

In another implementation, the system includes a solar panel including a set of solar substrings. The set of solar substrings can include a first solar substring: including a first group of solar cells arranged in series; and spanning a first area of the solar panel. Additionally, the set of solar substrings across the solar panel can include a second solar substring: including a second group of solar cells arranged in series; spanning a second area, adjacent the first area, of the solar panel; and connected in parallel to the first solar substrings. Alternatively, the set of solar substrings can include a first solar substring: including a first group of solar cells arranged in series; and spanning a first area of the solar panel. Additionally, the set of solar substrings across the solar panel can include a second solar substring: including a second group of solar cells arranged in series; spanning a second area, adjacent the first area, of the solar panel; and connected in series to the first solar substrings. It should be understood that the set of solar substrings can include solar substrings: arranged in series and/or in parallel to each other; and can each include solar cells arranged in series and/or in parallel to each other.

In one implementation, the first set of windings 132 includes: a first winding 133 (e.g., inductor, windings of a transformer) of a first quantity of turns (e.g., two turns) arranged in parallel to the first solar substring 112; and a second winding 134 (e.g., inductor, windings of a transformer) of a second quantity of turns (e.g., two turns)—matching the first quantity of turns of the first winding 133—arranged in parallel to the second solar substring 114 and in series to the first winding 133. Accordingly, responsive to differences in illumination conditions across the first solar substring 112 and the second solar substring 114, the arrangement of the first set of windings 132 induces balancing between the first operating voltage of the first solar substring 112 and the second operating voltage of the second solar substring 114 to a nominal operating voltage, which is then supplied to the power conversion circuit 120.

Additionally, the second set of windings 142—arranged in parallel to the first set of windings 132—includes a third quantity of turns (e.g., twenty-two turns) and is arranged in parallel to the first winding 133 and the second winding 134 of the first set of windings 132. Thus, the second set of windings 142: cooperates with the first set of windings 132 to form a step-up voltage transformer; and is configured to deliver a voltage output to the voltage output terminal 143 greater than the nominal operating voltage of the set of solar substrings 110.

4.1.2 Solar Panel Output Bus

In one implementation, the solar panel 105 includes: the set of solar substrings 110 arranged across a front side 106 of the solar panel 105; and a busbar 108 arranged on the rear side 107 of the solar panel 105 and coupled to the set of solar substrings 110. In particular, the busbar 108: is centrally located on the rear side 107 of the solar panel 105; and includes a panel output cable 109 coupled to the busbar 108. The panel output cable 109: defines a first quantity of connections (e.g., N+1 connections) corresponding to each solar substring, in the set of solar substrings 110, arranged across the front side 106 of the solar panel 105; and configured to couple to an input connector 184 of the power conversion circuit 120. Accordingly, the power conversion circuit 120 can then: balance a nominal output voltage supplied from the set of solar substrings 110; and maintain a target output voltage at a voltage output terminal 143 coupled to the power conversion circuit 120.

In one example, the solar panel 105 can include: a first solar substring 112 arranged across the front side 106 of the solar panel 105; a second solar substring 114 arranged across the front side 106 of the solar panel 105 and connected in parallel to the first solar substring 112; and a third solar substring arranged across the front side 106 of the solar panel 105 and connected in parallel to the second solar substring 114. In this example, each solar substring, in the set of solar substrings 110, includes: a negative end centrally located on the front side 106 of the solar panel 105; a positive end centrally located on the front side 106 of the solar panel 105 opposite the negative end; and a midpoint tap point coupled to the busbar 108 arranged on the rear side 107 of the solar panel 105. The solar panel 105 can further include the panel output cable 109: coupled to the busbar 108 on the rear side 107 of the solar panel 105; including a first quantity of connections corresponding to each solar substring, in the set of solar substrings 110, arranged across the front side 106 of the solar panel 105; and coupled to the input connector 184 of the power conversion circuit 120.

Thus, the power conversion circuit 120 can: balance voltage output from the first solar substring 112, the second solar substring 114, and the third solar substring to a nominal operating voltage; and convert the nominal operating voltage to a target output voltage (e.g., 400 volts) at the voltage output terminal 143.

Additionally, the system 100 can include: a second solar panel 105 including a second set of solar substrings arranged in parallel to each other; and a second busbar 108 arranged on a rear side 107 of the second solar panel 105 and including a second panel output cable 109 coupled to a second power conversion circuit 120. The second power conversion circuit 120: is coupled to the voltage output terminal 143; is in communication (e.g., wired, wireless communication) to the first power conversion circuit 120; and is configured to convert voltage supplied from the second set of solar substrings to a second target output voltage at the voltage output terminal 143.

Accordingly, the system 100 can then implement maximum power point tracking (hereinafter "MPPT") techniques to modify voltage output ratios across the first power conversion circuit 120 and the second power conversion circuit

120 in order to maintain the target output voltage at the voltage output terminal 143. Although, the following implementation describes an arrangement of two solar panels 105 and a set of three solar substrings, the system 100 can include any quantity of solar panels 105 and any quantity of parallelly arranged solar substrings.

4.1.3 Example: Dual-Substring Balancing+Alternating Polarity

In one example, the system 100 can: balance voltage output from the set of solar substrings 110 to a nominal operating voltage; and modify voltage output delivered to the voltage output terminal 143 by alternating voltage polarity across the first transformer 144. In this example, the system 100 includes the first set of windings 132 including: a first winding 133 arranged in parallel to a first solar substring 112 in the first set of solar substrings 110; and a second winding 134 arranged in series to the first winding 133 and parallel to a second solar substring 114 in the first set of solar substrings 110.

In this example, the first set of switches 135 includes a first subset of switches including a first transistor (e.g., field effect transistor or "FET") and a second transistor arranged in series to each other and coupled to the set of solar substrings 110. In particular, the first transistor includes: a first source coupled to a ground rail; a first drain coupled to a first junction; and a first gate coupled to a first control output at the controller 160. Additionally, the second transistor includes: a second source coupled to the first junction, the first junction coupling the first drain of the first transistor and the second source of the second transistor to the first winding 133; a second drain coupled to the first set of solar substrings 110; and a second gate coupled to a second control output at the controller 160.

Furthermore, the set of switches includes a second subset of switches including a third transistor (e.g., field effect transistor or "FET") and a fourth transistor arranged in series to each other and coupled to the set of solar substrings 110. In particular, the third transistor includes: a third source coupled to the ground rail; a third drain coupled to a second junction; and a third gate coupled to the second control output at the controller 160. Additionally, the fourth transistor includes: a fourth source coupled to the second junction, the second junction coupling the third drain of the third transistor and the fourth source of the fourth transistor to the second winding 134; a fourth drain coupled to the first set of solar substrings 110; and a fourth gate coupled to the first control output at the controller 160.

Accordingly, the controller 160 can, at a first time: set the first transistor and the fourth transistor into an active state by driving the first modulation signal (e.g., non-zero voltage signal) to the first gate of the first transistor and the fourth gate of the first transistor; set the second transistor and the third transistor into an inactive state by driving an inverse of the first modulation signal (e.g., zero voltage signal) to the second gate of the second transistor and the third gate of the third transistor; and direct current from the first set of solar substrings 110 in a first direction across the first set of windings 132 to induce a first voltage polarity across the first transformer 144.

Additionally, the controller 160 can then, at a second time following the first time: set the first transistor and the fourth transistor into an inactive state by driving the first modulation signal (e.g., zero voltage signal) to the first gate of the first transistor and the fourth gate of the first transistor; set the second transistor and the third transistor into an active state by driving the inverse of the first modulation signal (e.g., non-zero voltage signal) to the second gate of the second transistor and the third gate of the third transistor; and direct current from the first set of solar substrings 110 in a second direction, opposite the first direction, across the first set of windings 132 to induce a second voltage polarity, opposite the first voltage polarity across the first transformer 144.

Therefore, the system 100 can simultaneously: balance voltage output from the set of solar substrings 110 to a nominal operating voltage; increase the nominal operating voltage from the set of solar substrings 110 to a target output voltage; and modify the voltage at the voltage output terminal 143 to a target output voltage.

4.2 Voltage Control Section

In on implementation, the system 100 includes a power conversion circuit 120 including a voltage control section 140 coupled to the balancing section 130. In this implementation, the voltage control section 140 includes a second set of windings 142: arranged in parallel to the first set of windings 132 to define a first transformer 144; defining a set-up (e.g., 22 turns) voltage from the voltage across the first set of windings 132; and coupled to a voltage output terminal 143 (e.g., inverter, AC grid) configured to maintain a target output voltage (e.g., 400 volts). As described above, the system 100 triggers a first modulation signal at the first set of switches 135 to induce an alternative voltage polarity across the first set of windings 132, which induces the alternating voltage polarity across the first transformer 144 (i.e., the voltage polarity across the first set of windings 132 alternates in phase with the second set of windings 142).

Additionally, the voltage control section 140 includes a second transformer 145: coupled to the balancing section 130; and cooperating with the first transformer 144 to modify (e.g., increase, attenuate) the output voltage at the voltage output terminal 143. In particular, the second transformer 145 includes: a third winding arranged in series with the second winding 134 of the first transformer 144; and a fourth winding arranged parallel to the third winding to form the second transformer 145. Furthermore, the voltage control section 140 can include an output capacitor 150: arranged in series with the third winding; and configured to transfer (e.g., store, discharge) energy (e.g., electrical energy) routed from the second winding 134 and the third winding coupled to the voltage control section 140. Thus, the system 100: forms a serial arrangement across the output capacitor 150, the third winding, the second winding 134, and the voltage output terminal 143; and can modify voltage polarity, as described below, across the first transformer 144 and the second transformer 145 resulting in adjustments (e.g., increasing, attenuating) in output voltage at the voltage output terminal 143.

In the aforementioned implementation, the voltage control section 140 further includes a charging capacitor 152 arranged in series with the fourth windings. Additionally, the voltage control section 140 includes a second set of switches 148: coupled to the fourth set of windings 147 of the second transformer 145; and configured to route output current (e.g., via a voltage converter 170) from the set of solar substrings 110 through the fourth set of windings 147 toward the charging capacitor 152 thereby defining a second voltage polarity across the second transformer 145. In particular, the second set of switches 148 includes: a fifth switch coupled to an output voltage from the set of solar substrings 110 (e.g., via a voltage converter 170); and a sixth switch arranged in series with the fifth switch to define a fifth junction coupled to the fourth winding. The system 100 can thus: trigger a second modulation signal at the second set of switches 148; and induce a second alternating voltage polarity across the second transformer 145 that cooperates with the first alternating voltage polarity from the first transformer 144 to modify (e.g., increase, attenuate) output voltage at the voltage output terminal 143.

In one example, the system 100 can: trigger a second modulation signal (e.g., square wave) at the sixth switch; and trigger an inverse second modulation signal (e.g., inversely proportional to the second modulation signal) at the fifth switch (e.g., via a logic inverter). Thus, during operation, the system 100 can operate (e.g., at a target duty cycle) the second set of switches 148 between: a third operating state in which the sixth switch is operating in an on-state and the fifth switch is operating in an off-state; and a fourth operating state in which the sixth switch is operating in the off-state; and the fifth switch is operating in the on-state. In the third operating state, current output from the set of solar substrings 110 is routed from the charging capacitor 152, the fourth set of windings 147, and sixth switch to define a third voltage polarity across the second transformer 145. In the fourth operating state, current output from the set of solar substrings 110 is routed through the fifth switch, the fourth set of windings 147, and the output capacitor 150 to define a fourth voltage polarity, different from the third voltage polarity, across the second transformer 145.

Therefore, the system 100 can trigger the second modulation signal at the second set of switches 148 to induce a second alternating voltage polarity across the second transformer 145 that cooperates with the first alternating voltage polarity across the first transformer 144 to: modify (e.g., increase, attenuate) the output voltage at the voltage output terminal 143 coupled to the voltage control section 140; and maintain a target output voltage regardless of environmental conditions affecting the set of solar substrings 110.

4.2.1 Voltage Converter

In one implementation, the system 100 includes a voltage converter 170 (e.g., bi-directional voltage converter 170): coupled to the output voltage from the set of solar substrings 110 at the balancing section 130 and the second set of switches 148 at the voltage control section 140; and defining a voltage ratio between the output voltage from the set of solar substrings 110 and the input voltage at the fifth switch in the second set of switches 148. In this implementation, the voltage converter 170 can operate as "black box" configured to transfer electrical energy asynchronously between the set of solar substrings 110 and the second transformer 145 at the voltage control section 140. The voltage converter 170 can include a set of inputs configured to receive modulation signals from the controller 160 that define a particular duty cycle that sets the voltage ratio between the input and output of the voltage converter 170. Additionally and/or alternatively, the system 100 can trigger the modulation signals delivered to the voltage converter 170 to operate independently (e.g., different phase, frequency) from the first modulation signal at the first set of switches 135 and the second modulation signal at the second set of switches 148.

In one example, the voltage converter 170 includes a third set of switches including: a seventh switch coupled to the output voltage from the set of solar substrings 110; and an eighth switch arranged in series to the seventh switch to define a sixth junction. Additionally, the voltage converter 170 can include: a fifth winding (e.g., inductor) coupled at the sixth junction; and a capacitor coupled to the fifth winding to define a seventh junction and arranged in parallel to the eighth switch. In this example, the system 100 can: trigger a third modulation signal at the third set of switches that defines a particular duty cycle to set the voltage ratio between the input voltage at the seventh switch and the output voltage at the seventh junction.

Therefore, the system 100 can include a bidirectional voltage converter 170: coupling the set of solar substrings 110 to the second transformer 145; and defining a voltage ratio transferred across the second transformer 145 toward the charging capacitor 152 that induces the second alternating voltage polarity across the second transformer 145 to modify the output voltage and the voltage output terminal 143.

4.2.2 Example: Second Transformer Alternating Polarity

In one example, the system 100 can: balance voltage output from the set of solar substrings 110 to a nominal operating voltage; and modify voltage output delivered to the voltage output terminal 143 by alternating voltage polarity across the second transformer 145. In this example, the fourth set of windings 147 of the second transformer 145 includes: a first end coupled to a third junction; and a second end coupled to the charging capacitor 152 coupled to the ground rail.

In this example, the second set of switches 148 includes a fifth transistor (e.g., field effect transistor, or "FET") and a sixth transistor arranged in series to each other and coupled to the fourth set of windings 147. In particular, the fifth transistor includes: a fifth source coupled to the ground rail; a fifth drain coupled to the third junction; and a fifth gate coupled to a third control output at the controller 160. Additionally, the sixth transistor includes: a sixth source coupled to the third junction, the third junction coupling the fifth drain of the fifth transistor and the sixth source of the sixth transistor to the first end of the fourth set of windings 147; a sixth drain; and a sixth gate coupled to a fourth control output at the controller 160. Furthermore, the voltage converter 170: couples a voltage output from the set of solar substrings 110 to the sixth drain of the sixth transistor; and is configured to transfer electrical energy asynchronously between the set of solar substrings 110 and the fourth set of windings 147.

Accordingly, the controller 160 can, at a first time: set the fifth transistor into an active state by driving the second modulation signal (e.g., non-zero voltage signal) to the fifth gate of the fifth transistor; set the sixth transistor into an inactive state by driving an inverse of the second modulation signal (e.g., zero voltage signal) to the sixth gate of the sixth transistor; and direct current from the charging capacitor 152 in a third direction across the fourth set of windings 147 to induce a third voltage polarity (e.g., in-phase or out-of-phase with the first voltage polarity of the first transformer 144) across the second transformer 145.

Additionally, the controller 160 can then, at a second time following the first time: set the fifth transistor into an inactive state by driving the second modulation signal (e.g., zero voltage signal) to the fifth gate of the fifth transistor; set the sixth transistor into an inactive state by driving the inverse of the second modulation signal (e.g., non-zero voltage signal) to the sixth gate of the sixth transistor; and direct current from the bidirectional converter in a fourth direction, opposite the third direction, across the fourth set of windings 147 to induce a fourth voltage polarity (e.g., in-phase or out-of-phase with the second voltage polarity of the first transformer 144), opposite the third voltage polarity, across the second transformer 145.

Therefore, the system 100 can simultaneously: balance voltage output from the set of solar substrings 110 to a nominal operating voltage; and modify (or "convert") the nominal operating voltage to a target voltage output at the voltage output terminal 143 by combining voltage polarities across the first transformer 144 and the second transformer 145.

5.0 Controller

Generally, the system 100 includes a controller 160 configured to: read electrical values (e.g., voltage, current) from the set of solar substrings 110 coupled to the power conversion circuit 120; and, in response to electrical values (e.g., voltage, current) deviating from a target output voltage, induce alternating voltage polarities across the first transformer 144 and the second transformer 145 in the power conversion circuit 120 to modify an output voltage from the voltage output terminal 143 toward the target output voltage. In particular, the system 100 can: implement maximum power point tracking techniques to interpret an operating condition (e.g., above max power, below max power) for the set of solar substrings 110; and, in response to the operating condition deviating from a maximum power point condition, trigger modulation signals at the first set of switches 135 and the second set of switches 148 to induce alternate voltage polarity across the first transformer 144 and the second transformer 145 in order to modify (e.g., increase, attenuate) output voltage from the power conversion circuit 120.

5.1 Switching States: In Phase

Figure 3B:
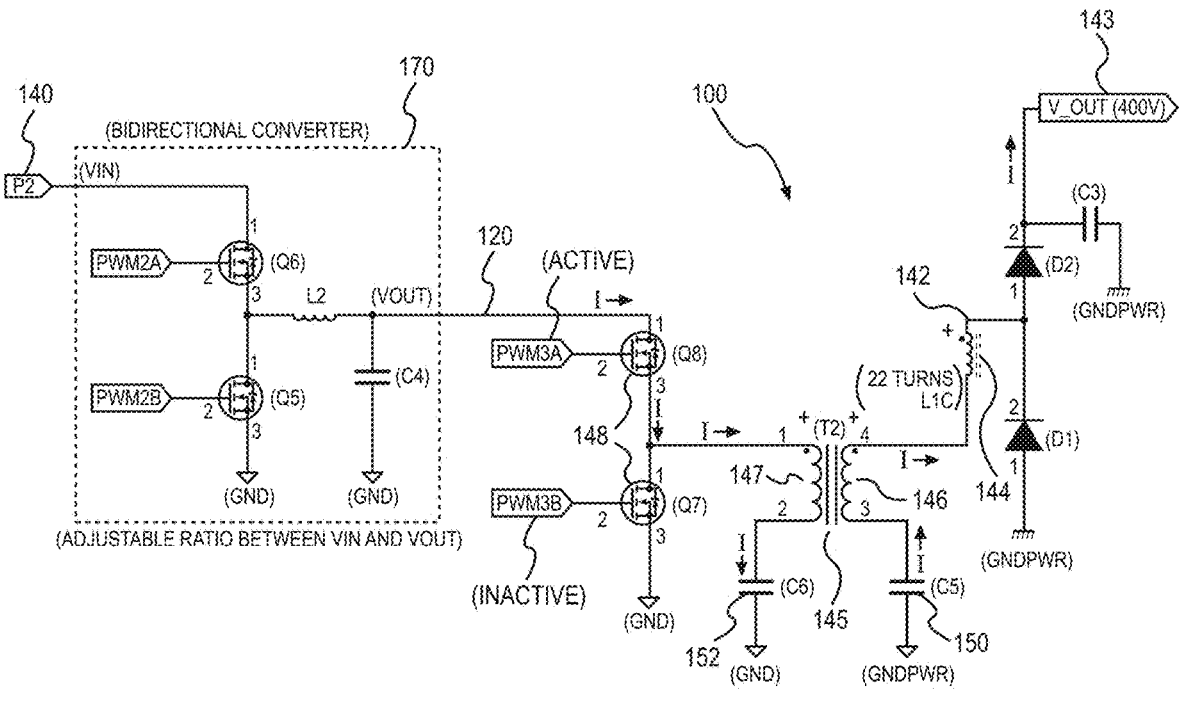
Figure 3B:
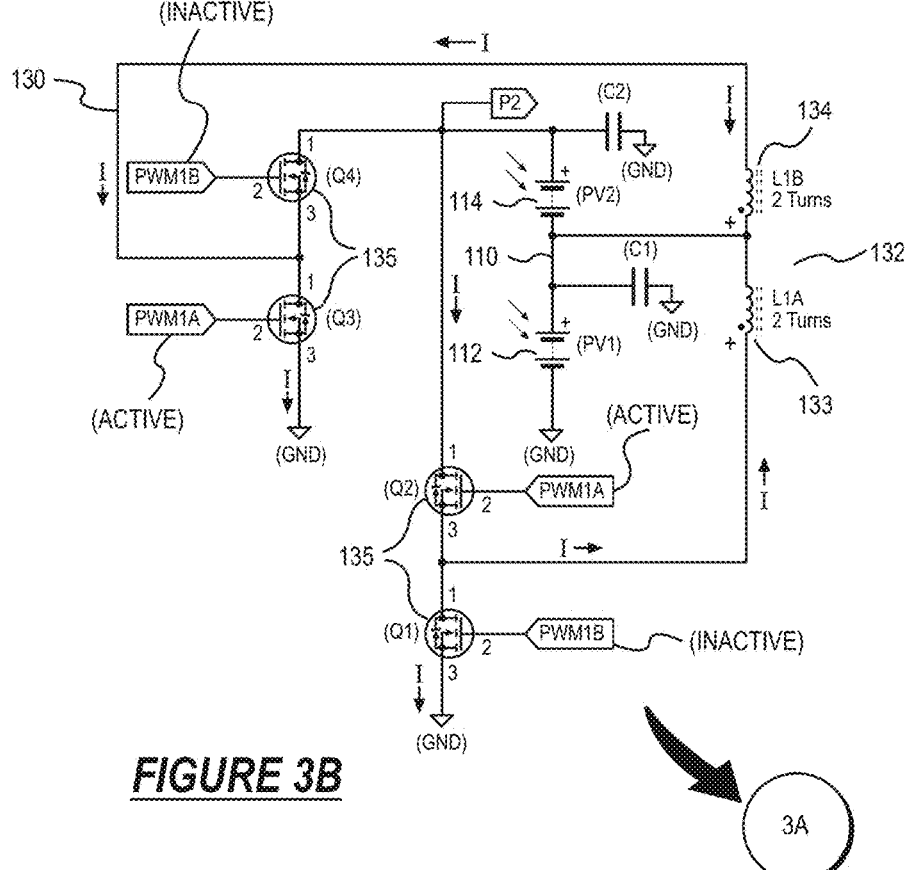

In one implementation, shown in FIGS. 3A and 3B, the system 100 can operate in a first alternating configuration in which the first alternating voltage polarity across the first transformer 144 performs in-phase with the second alternating voltage polarity across the second transformer 145. In this first alternating configuration, the first transformer 144 and the second transformer 145 cooperate (e.g., add energy) to increase a voltage output at the voltage output terminal 143. In this implementation, the system 100 can: trigger the first modulation signal at the first set of switches 135; and trigger the second modulation signal, matching (e.g., same phase, frequency) the first modulation signal, at the second set of switches 148 to induce matching voltage polarities across the first transformer 144 and the second transformer 145, thereby increasing voltage output.

More specifically, the controller 160 can: read a voltage output from the voltage output terminal 143; and, in response to the voltage output falling below the target output voltage (e.g., 400 volts), drive the first modulation signal of a first phase to the first set of switches 135 to 1) balance voltage output from the first set of solar substrings 110 across the first set of windings 132 and 2) induce a first alternating voltage polarity of the first phase across the first transformer 144. Simultaneously, in response to the voltage output falling below the target output voltage (e.g., 400 volts) the controller 160 can, drive the second modulation signal of a second phase matching the first phase at the second set of switches 148 to 1) induce a second alternating voltage polarity in-phase with the first alternating voltage polarity across the second transformer 145 and 2) increase the first voltage output toward the target output voltage by combining electrical energy from the first transformer 144, the second transformer 145, and the output capacitor 150 to the voltage output terminal 143.

In one implementation, during a first time period (e.g., a recharge period), the controller 160 can drive the first modulation signal of the first phase to operate a first subset of switches, in the first set of switches 135, in an active state to: direct electrical current from the first set of solar substrings 110 in a first direction across the first set of windings 132; and induce a first voltage polarity across the first transformer 144. Simultaneously, during the first time period, the controller 160 can drive the second modulation signal of the first phase to operate a first switch, in the second set of switches 148, in an active state to: direct electrical current from the charging capacitor 152 in a second direction across the fourth set of windings 147; induce a second voltage polarity, matching the first voltage polarity, across the second transformer 145; and electrically charge the output capacitor 150 based on a combination of electrical current from the second set of windings 142 and the third set of windings 146.

In this implementation, during a second time period (e.g., delivery period) following the first time period, the controller 160 can drive the first modulation signal of the first phase to operate a second subset of switches—in the first set of switches 135—in an active state: to direct electrical current from the first set of solar substrings 110 in a third direction, opposite the first direction, across the first set of windings 132; and to induce a third voltage polarity, opposite the first voltage polarity, across the first transformer 144. Simultaneously, during the second time period, the controller 160 can drive the second modulation signal of the first phase to operate a second switch, in the second set of switches 148, in an active state to: direct electrical current from the voltage converter 170 in a fourth direction, opposite the second direction, across the fourth set of windings 147 to the charging capacitor 152; induce a fourth voltage polarity, matching the third voltage polarity, across the second transformer 145; and induce a second voltage output, greater than the first voltage output, at the voltage output terminal 143 based on a combination of electrical current from the second set of windings 142, the third set of windings 146, and the output capacitor 150. Accordingly, the matching voltage polarities between the first transformer 144 and the second transformer 145 cooperate to increase the voltage at the voltage output terminal 143.

In one example, during operation in the first alternating configuration, the system 100 transitions between: a first recharge state to supply energy toward the output capacitor 150 coupled to the third set of windings 146; and a second delivery state to induce positive voltage across the output capacitor 150, the third set of windings 146, and the second set of windings 142 to increase output voltage at the voltage output terminal 143. In the first recharge state, the system 100 triggers: the first switch, fourth switch, and sixth switch to operate in the on-state; and the second switch, the third switch, and the fifth switch, to operate in the off-state. In this first recharge state: current from the set of solar substrings 110 flows across the isolation boundary of the first transformer 144 to induce a first voltage polarity, through the third set of windings 146 of the second transformer 145, and toward the output capacitor 150 to store electrical energy; and current from the charging capacitor 152 is transferred through the fourth set of windings 147 toward the sixth switch to induce a second voltage polarity matching the first voltage polarity across the second transformer 145. In the second delivery state, the system 100 triggers: the first switch, fourth switch, and sixth switch to operate in the off-state; and the second switch, the third switch, and the fifth switch, to operate in the on-state. In the second delivery state: current from the first output capacitor 150 is routed through the third set of windings 146 and the second set of windings 142 toward the voltage output terminal 143 to increase output voltage; and current from the set of solar substrings 110 is routed through the fourth set of windings 147 to transfer energy toward the charging capacitor 152.

Therefore, in response to interpreting an electrical value (e.g., voltage) that falls below a target voltage, the system 100 can initiate the first alternating configuration across the first set of switches 135 and the second set of switches 148 to increase output voltage at the voltage output terminal 143.

5.2 Switching States: Out of Phase

Figure 4A:
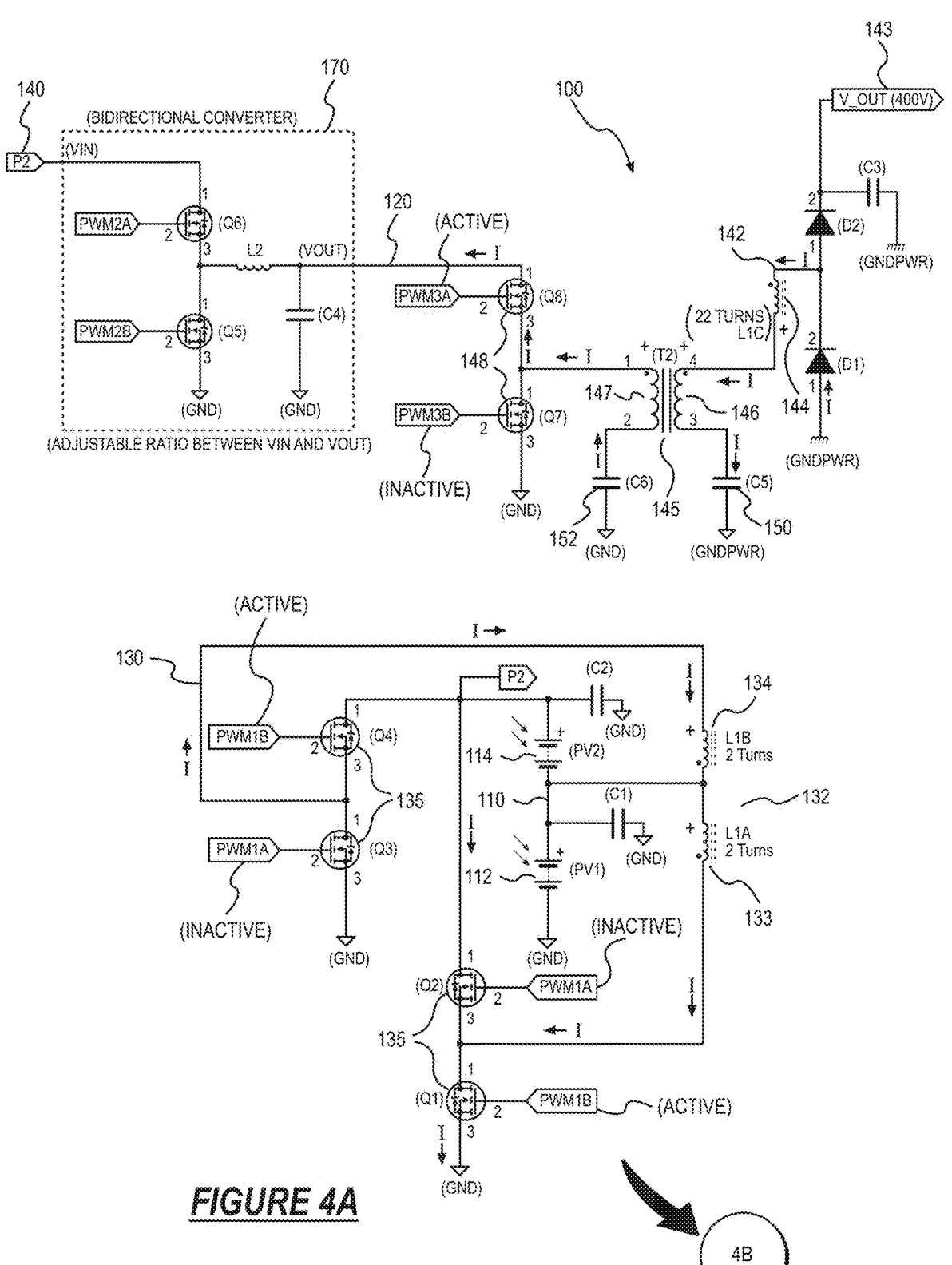
FIGS. 4A and 4B are schematic representations of the system.
Figure 4B:
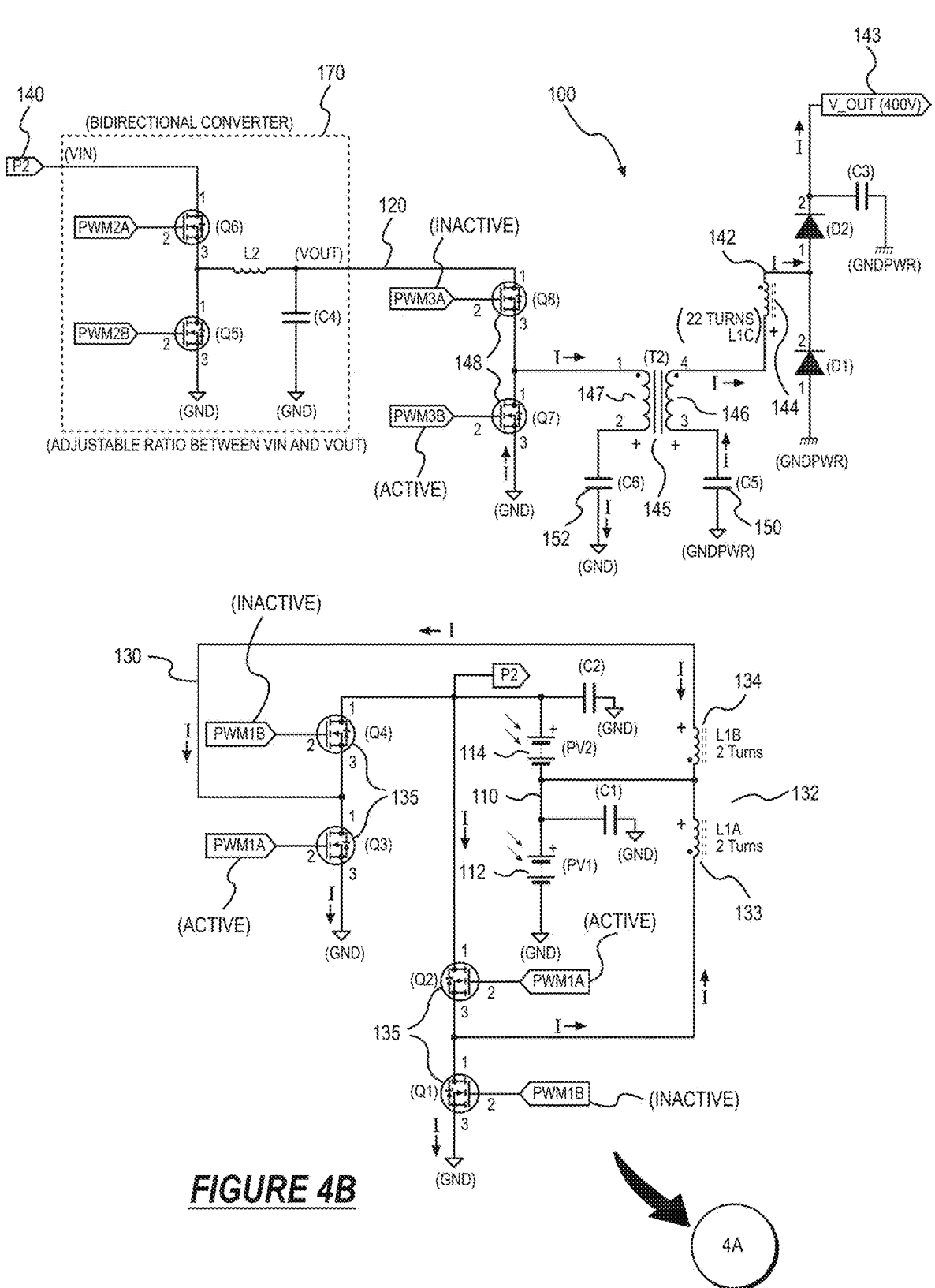

In another implementation, shown in FIGS. 4A and 4B, the system 100 can operate in a second alternating configuration in which the first alternating voltage polarity across the first transformer 144 operates out-of-phase with the second alternating voltage polarity across the second transformer 145. In this second alternating configuration, the first transformer 144 and the second transformer 145 cooperate (e.g., subtract energy) to attenuate voltage at the voltage output terminal 143. In this implementation, the system 100 can: trigger the first modulation signal at the first set of switches 135; and trigger the second modulation signal, different (e.g., inverse phase) from the first modulation signal, at the second set of switches 148 to induce out-of-phase voltage polarities across the first transformer 144 and the second transformer 145 thereby attenuating voltage output.

More specifically, the controller 160 can: read a voltage output from the voltage output terminal 143; and, in response to the voltage output exceeding the target output voltage (e.g., 400 volts), drive the first modulation signal of a first phase at the first set of switches 135 to 1) balance voltage output from the first set of solar substrings 110 across the first set of windings 132 and 2) induce a first alternating voltage polarity of the first phase across the first transformer 144. Simultaneously, the controller 160 can drive the second modulation signal of a second phase—offset 180 degrees (or "inverse") from the first phase of the first modulation signal—at the second set of switches 148 to: induce a second alternating voltage polarity inverse to the first alternating voltage polarity across the second transformer 145; and attenuate the voltage output toward the target output voltage (e.g., 400 volts) by combining electrical energy from the first transformer 144, the second transformer 145, and the output capacitor 150 to the voltage output terminal 143.

In one implementation, during a first time period (e.g., recharge period), the controller 160 can drive the first modulation signal of a first phase to operate a first subset of switches, in the first set of switches 135, in an active state to: direct electrical current from the first set of solar substrings 110 in a first direction across the first set of windings 132; and induce a first voltage polarity across the first transformer 144. Simultaneously, during the first time period (e.g., recharge period), the controller 160 can drive the second modulation signal of a second phase inverse from the first phase to operate a second switch, in the second set of switches 148, in an active state to: direct electrical current from the charging capacitor 152 in a second direction across the fourth set of windings 147 to the bidirectional converter; induce a second voltage polarity, opposite the first voltage polarity, across the second transformer 145; and electrically charge the output capacitor 150 based on a combination of electrical current from the second set of windings 142 and the third set of windings 146.

In this implementation, during a second time period (e.g., delivery period) following the first time period (e.g., recharge period), the controller 160 can drive the first modulation signal of the first phase to operate a second subset of switches, in the first set of switches 135, in an active state to: direct electrical current from the first set of solar substrings 110 in a third direction, opposite the first direction, across the first set of windings 132; and induce a third voltage polarity, opposite the first voltage polarity, across the first transformer 144. Simultaneously, during the second time period (e.g., delivery period), the controller 160 can drive the second modulation signal of the second phase inverse from the first phase to operate a first switch, in the second set of switches 148, in an active state to: direct electrical current from the charging capacitor 152 in a fourth direction, opposite the second direction, across the fourth set of windings 147; induce a fourth voltage polarity, opposite the third voltage polarity, across the second transformer 145; and induce a second voltage output, less than the first voltage output, at the voltage output terminal 143 based on a combination of electrical current from the second set of windings 142, the third set of windings 146, and the output capacitor 150. Accordingly, the first transformer 144 and the second transformer 145 can operate in opposing voltage polarities that cooperate to attenuate the voltage delivered to the voltage output terminal 143.

In one example, during operation in the second alternating configuration, the system 100 transitions between: a third recharge state to attenuate energy transferred toward the output capacitor 150 coupled to the third set of windings 146; and a fourth delivery state to attenuate voltage across the output capacitor 150, the third set of windings 146, and the second set of windings 142 and transferred to the voltage output terminal 143. In the third recharge state, the system 100 triggers: the first switch, fourth switch, and fifth switch to operate in the on-state; and the second switch, the third switch, and the sixth switch, to operate in the off-state. In the third recharge state, current from the set of solar substrings 110 flows across the isolation boundary of the first transformer 144 to induce a first voltage polarity, through the third set of windings 146 of the second transformer 145, and toward the output capacitor 150 to store electrical energy; current from the charging capacitor 152 is transferred through the fourth set of windings 147 toward the fifth switch to induce a second voltage polarity, opposing the first voltage polarity, across the second transformer 145. In the fourth delivery state, the system 100 triggers: the first switch, fourth switch, and fifth switch to operate in the off-state; and the second switch, the third switch, and the sixth switch, to operate in the on-state. In the fourth delivery state: the voltage difference between the first output capacitor 150, the third set of windings 146, and the second set of windings 142 is routed towards the voltage output terminal 143 to attenuate output voltage; and the current induced across the fourth set of windings 147 is routed toward the charging capacitor 152.

Therefore, in response to interpreting an electrical value (e.g., voltage) that is above a target voltage, the system 100 can initiate the second alternating configuration across the first set of switches 135 and the second set of switches 148 to attenuate output voltage at the voltage output terminal 143.

5.3 In-Phase+Out-of-Phase Alternation

In one implementation, the system 100 includes: the first set of solar substrings 110 arranged in parallel and configured to operate at a voltage output range between 20 volts and 40 volts; and the voltage output terminal 143 configured to output target output voltage range between 350 volts and 450 volts. In this implementation, varying environmental conditions (e.g., clouds, shadow, debris, structures) result in varying voltage output from the set of solar substrings 110, which results in varying output voltage (e.g., greater or less than 400 volts) from the voltage output terminal 143. Accordingly, the system 100 can then transition between: an in-phase operating configuration, as described above, responsive to reading a voltage output less than the target output voltage (e.g., less than 400 volts) at the voltage output terminal 143; and an out-of-phase operating configuration, as described above, responsive to reading a voltage output exceeding the target output voltage (e.g., greater than 400 volts) at the voltage output terminal 143. Therefore, the system 100 can: balance voltage from a set of solar substrings 110 to a nominal operating voltage; and maintain the target output voltage (e.g., 400 voltage) at the voltage output terminal 143 by transitioning between the in-phase operating configuration and the out-of-phase operating configuration.

Additionally and/or alternatively, the system 100 can implement maximum power point tracking (or "MPPT") techniques (e.g., across a single or multiple power conversion circuits 120) to achieve and maintain a target power output at the output terminal.

6. Enclosure+Multiple Solar Panel Setup

In one implementation, the system 100 can include an enclosure 180 including: a printed circuit board assembly 182 (or "PCBA") including the power conversion circuit 120; an input connector 184 configured to receive the panel output cable 109 and electrically couple the set of solar substrings 110 to the balancing section 130 of the power conversion circuit 120; and an output connector 186 configured to couple the voltage control section 140 of the power conversion circuit 120 to the voltage output terminal 143 (e.g., alternating current grid, battery bank). Accordingly, the system 100 can include a set of enclosures 180: corresponding to a set of solar panels 105, such as arranged on a roof of a building structure; each housing a printed circuit board assembly 182 including the power conversion circuit 120; and electrically coupling the set of solar panels 105 to the voltage output terminal 143. Thus, the system 100 can then implement steps described above to balance output voltage from the solar panels 105 and maintain a target output voltage from the set of solar panels 105 at the voltage output terminal 143.

In one example, the enclosure 180 including the PCBA is coupled (e.g., adhesively bonded) to the rear side 107 of the solar panel 105. In this example, the panel output cable 109 is coupled to the input connector 184 of the enclosure 180 and a terminal cable couples the output connector 186 of the enclosure 180 to the voltage grid (e.g., via an inverter). In another example, the enclosure 180 including the PCBA is arranged separate from solar panel 105. In this example, the panel output cable 109 is coupled between the rear end of the solar panel 105 to the input connector 184 of the enclosure 180 and the terminal cable couples the output connector 186 the voltage grid.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A system comprising a power conversion circuit, the power conversion circuit comprising:
   a first set of windings:
      arranged in parallel to a first set of solar substrings; and
      configured to balance voltage output from the first set of solar substrings;
   an adjustment transformer:
      coupling the first set of solar substrings to a first energy storage element; and
      configured to supply electrical energy from the first set of solar substrings to the first energy storage element;
   an inductive element coupled to the first set of windings and the adjustment transformer;
   a first set of switches:
      coupled to the first set of windings; and
      configured to alternate voltage polarity across the first set of windings to drive the balanced voltage output from the first set of windings to a first voltage, greater than the balanced voltage output, at the inductive element; and
   a second set of switches:
      coupled to the adjustment transformer; and
      configured to alternate voltage polarity across the adjustment transformer to drive the first voltage at the inductive element to a target voltage output by transferring electrical energy from the first energy storage element to the inductive element.

2. The system of claim 1, further comprising a controller configured to:
   drive a first modulation signal to the first set of switches at a first phase to induce the alternating voltage polarity across the first set of windings that drives the balanced voltage output from the first set of windings to the first voltage at the inductive element; and
   in response to the first voltage falling below the target voltage:
      drive a second modulation signal to the second set of switches at a second phase, approximating the first phase, to induce the alternating voltage polarity across the adjustment transformer that drives the first voltage at the inductive element to the target voltage.

3. The system of claim 1, further comprising a controller configured to:
   drive the first modulation signal to the first set of switches at a first phase to induce the alternating voltage polarity across the first set of windings that drives the balanced voltage output from the first set of windings to the first voltage at the inductive element; and
   in response to the first voltage exceeding the target voltage:
      drive a second modulation signal to the second set of switches at a second phase, inverse the first phase, to induce the alternating voltage polarity across the adjustment transformer that attenuates the first voltage at the inductive element to the target voltage.

18

4. The system of claim 1, wherein the inductive element comprises a complementary winding cooperating with the first set of windings to form a voltage transformer defining a step-up winding ratio that transforms the balanced voltage across the first set of windings to the first voltage across the complementary winding.

5. The system of claim 1, wherein the inductive element comprises a voltage transformer comprising:
   an input winding coupled to the first set of windings; and
   an output winding:
      coupled to the adjustment transformer; and
      cooperating with the input winding to define a step-up winding ratio that transforms the balanced voltage output across the first set of windings to the first voltage across the output winding.

6. The system of claim 1:
   further comprising:
      the first energy storage element coupled to an output side of the adjustment transformer; and
      a second energy storage element coupled to an input side of the adjustment transformer; and
   wherein the power conversion circuit further comprises a bidirectional converter:
      coupling the first set of solar substrings to the adjustment transformer; and
      configured to supply electrical energy from the first set of solar substrings to the second energy storage element.

7. The system of claim 6, further comprising a controller configured to, in response to the first voltage deviating from the target voltage, drive a modulation signal to the second set of switches that induces an alternating voltage polarity across the adjustment transformer to:
   transfer electrical energy stored within the second energy storage element to the first energy storage element; and
   transfer electrical energy storage stored within the first energy storage element to the inductive element.

8. The system of claim 1, further comprising a controller configured to, in response to the first voltage falling below the target voltage, alternate operation of the power conversion circuit between a recharge state and a delivery state by:
   driving a first modulation signal to the first set of switches to induce a first alternating voltage polarity across the inductive element; and
   driving a second modulation signal to the second set of switches to induce a second alternating voltage polarity across the adjustment transformer, the second alternating voltage polarity in phase with the first alternating voltage polarity across the inductive element.

9. The system of claim 8:
   further comprising:
      the first energy storage element coupled to an output side of the adjustment transformer; and
      a second energy storage element coupled to an input side of the adjustment transformer; and
   wherein the adjustment transformer is configured to:
      in the recharge state:
         transfer electrical energy from the inductive element to the first energy storage element; and
         transfer electrical energy from the second energy storage element to the first energy storage element; and
      in the delivery state:
         transfer electrical energy stored in the first energy storage element to the inductive element; and
         transfer electrical energy from the first set of solar substrings to the second energy storage element.

10. The system of claim 1, further comprising a controller configured to, in response to the first voltage exceeding the target voltage, alternate operation of the power conversion circuit between a recharge state and a delivery state by:

driving a first modulation signal to the first set of switches to induce a first alternating voltage polarity across the inductive element; and driving a second modulation signal to the second set of switches to induce a second alternating voltage polarity across the adjustment transformer, the second alternating voltage polarity out of phase with the first alternating voltage polarity across the inductive element.

11. The system of claim 10:

further comprising:

the first energy storage element coupled to an output side of the adjustment transformer; and a second energy storage element coupled to an input side of the adjustment transformer; and wherein the adjustment transformer is configured to in the recharge state:

transfer electrical energy from the inductive element to the first energy storage element; and transfer electrical energy from the second energy storage element to the first set of solar substrings; and in the delivery state, transfer electrical energy stored in the first energy storage element to the inductive element and the second energy storage element.

12. The system of claim 1, wherein the first set of windings:

comprises:

a first winding of a first quantity of turns arranged in parallel to a first solar substring in the first set of solar substrings; and a second winding of a second quantity of turns:

approximating the first quantity of turns;

arranged in parallel to a second solar substring of the first set of solar substrings; and arranged in series with the first winding; and are configured to passively balance a first operating voltage output from the first solar substring and a second operating voltage output from the second solar substring across the first winding and the second winding.

13. The system of claim 12, wherein the first set of switches comprises:

a first subset of switches coupled to the first winding; and a second subset of switches:

coupled to the second winding; and cooperating with the first subset of switches to alternate voltage polarity across the first winding and the second winding based on a control signal supplied to the first set of switches from a controller.

14. The system of claim 1:

wherein the adjustment transformer comprises:

an input winding; and an output winding coupled to the first energy storage element and the inductive element; and wherein the second set of switches:

couple the first set of solar substrings to the input winding of the adjustment transformer; and are configured to alternate voltage polarity across the input winding to induce an adjustment voltage across the output winding of the adjustment transformer based on a voltage output from the first set of solar substrings to the first winding of the adjustment transformer.

15. A system comprising:

a power conversion circuit comprising:

a first set of windings arranged in parallel to a first set of solar substrings;

an adjustment transformer:

coupling the first set of solar substrings to an energy storage element; and configured to supply electrical energy from the first set of solar substrings to the energy storage element;

an inductive element coupled to the first set of windings and the adjustment transformer;

a first set of switches coupled to the first set of windings; and a second set of switches coupled to the adjustment transformer; and a controller configured to:

drive a first modulation signal to the first set of switches to induce an alternating voltage polarity across the first set of windings that drives a voltage output from the first set of windings to a first voltage at the inductive element; and in response to the first voltage deviating from a target voltage:

drive a second modulation signal to the second set of switches to induce an alternating voltage polarity across the adjustment transformer to drive the first voltage at the inductive element to the target voltage by transferring energy from the energy storage element to the inductive element.

16. The system of claim 15, wherein the controller is configured to:

drive the first modulation signal to the first set of switches at a first phase to induce the alternating voltage polarity across the first set of windings that drives the voltage output from the first set of windings to the first voltage at the inductive element; and in response to the first voltage falling below the target voltage:

drive a second modulation signal to the second set of switches at a second phase, approximating the first phase, to induce an alternating voltage polarity across the adjustment transformer to increase the first voltage at the inductive element to the target voltage.

17. The system of claim 15, wherein the controller is configured to:

drive the first modulation signal to the first set of switches at a first phase to induce the alternating voltage polarity across the first set of windings that drives the voltage output from the first set of windings to the first voltage at the inductive element; and in response to the first voltage exceeding the target voltage:

drive a second modulation signal to the second set of switches at a second phase, opposite the first phase, to induce an alternating voltage polarity across the adjustment transformer to decrease the first voltage at the inductive element to the target voltage.

18. A power conversion circuit comprising:

a first set of windings arranged in parallel to a first set of solar substrings;

an adjustment transformer:

coupling the first set of solar substrings to an energy storage element; and configured to supply electrical energy from the first set of solar substrings to the energy storage element;

an inductive element coupled to the first set of windings and the adjustment transformer;

a first set of switches:

coupled to the first set of windings; and configured to alternate voltage polarity across the first set of windings to drive a voltage output from the first set of windings to a first voltage, greater than the voltage output, at the inductive element; and a second set of switches:

coupled to the adjustment transformer; and configured to alternate voltage polarity across the adjustment transformer to drive the first voltage at the inductive element to a target voltage by transferring electrical energy from the energy storage element to the inductive element.

19. The system of claim 18, wherein the inductive element comprises a complementary winding cooperating with the first set of windings to form a voltage transformer defining a winding ratio that transforms the voltage output across the first set of windings to the first voltage across the complementary winding.

20. The system of claim 19, wherein the inductive element comprises a voltage transformer comprising:

an input winding coupled to the first set of windings; and an output winding:

coupled to the adjustment transformer; and cooperating with the input winding to define a winding ratio that transforms the voltage output across the first set of windings to the first voltage across the output winding.

* * * * *